(12) United States Patent
Shiue et al.

(10) Patent No.: US 7,999,450 B2
(45) Date of Patent: Aug. 16, 2011

(54) ELECTROLUMINESCENT MODULE WITH THERMAL-CONDUCTING CARRIER SUBSTRATE

(75) Inventors: Ching-Chuan Shiue, Taoyuan Hsien (TW); Hsueh-Kuo Liao, Taoyuan Hsien (TW); Huang-Kun Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 532 days.

(21) Appl. No.: 11/944,309

(22) Filed: Nov. 21, 2007

(65) Prior Publication Data

US 2008/0143245 A1 Jun. 19, 2008

(30) Foreign Application Priority Data

Dec. 18, 2006 (TW) ................................ 95147379 A

(51) Int. Cl.
*H05B 33/00* (2006.01)
*H01L 33/00* (2010.01)

(52) U.S. Cl. ............ 313/11; 313/498; 313/512; 313/46; 257/98; 257/99; 257/100

(58) Field of Classification Search .................. 313/512; 257/88, 99
See application file for complete search history.

(56) References Cited

U.S. PATENT DOCUMENTS

| | | | | |
|---|---|---|---|---|
| 6,809,261 B1 * | 10/2004 | Ng et al. | ......................... | 174/551 |
| 2003/0178627 A1 * | 9/2003 | Marchl et al. | .................... | 257/80 |
| 2006/0012299 A1 * | 1/2006 | Suehiro et al. | ................. | 313/512 |
| 2006/0124953 A1 * | 6/2006 | Negley et al. | ................. | 257/99 |
| 2007/0075306 A1 * | 4/2007 | Hayashi et al. | ................. | 257/13 |
| 2008/0029772 A1 * | 2/2008 | Chiang | ........................... | 257/88 |

* cited by examiner

*Primary Examiner* — Sikha Roy
(74) *Attorney, Agent, or Firm* — Birch, Stewart, Kolasch & Birch, LLP

(57) ABSTRACT

An electroluminescent module includes a module substrate, a thermal-conducting carrier substrate and a light-emitting element. The module substrate has an opening, a first surface and a first patterned electrode disposed on the first surface. The thermal-conducting carrier substrate has a carrying element and a second patterned electrode disposed on the carrying element. The carrying element is disposed opposite to the first surface of the module substrate, and the second patterned electrode is disposed facing to the first patterned electrode and electrically connected to the first patterned electrode. The light-emitting element is located at the opening and disposed on the thermal-conducting carrier substrate. The light-emitting element has a first electrode and a second electrode, both of which are respectively electrically connected to the corresponding portions of the second patterned electrode of the thermal-conducting carrier substrate.

20 Claims, 7 Drawing Sheets

ELECTROLUMINESCENT MODULE WITH THERMAL-CONDUCTING CARRIER SUBSTRATE

CROSS REFERENCE TO RELATED APPLICATIONS

This Non-provisional application claims priority under 35 U.S.C. §119(a) on Patent Application No. 095147379, filed in Taiwan, Republic of China on Dec. 18, 2006, the entire contents of which are hereby incorporated by reference.

BACKGROUND OF THE PRESENT INVENTION

1. Field of Invention

The present invention relates to a luminescent module, and more particularly to an electroluminescent module.

2. Related Art

In recent years, advances in electroluminescent technology push material and manufacturing techniques of light emitting diode (LED) forward. Their applications range from indicators of computers or home appliances, backlight sources of liquid crystal displays, to traffic lights or vehicle lights. They may even be used as light sources of illumination. However, with increasing light emitting power, the LED also produces more heat. If such heat cannot be properly and effectively dissipated, the light emitting efficiency thereof will be lowered.

As shown in FIG. 1, a conventional LED module 1 is constituted by an LED package 11 and a module substrate 12, and the LED package 11 is constituted by an LED element 111, a carrier substrate 112 and a package material 113.

The LED element 111 is constituted by a p-type doped layer $P_{01}$, a light emitting layer $I_{01}$ and an n-type doped layer $N_{01}$, in sequence stacked together. Besides, the LED element 111 also has a p-type contacting electrode $E_{01}$ and an n-type contacting electrode $E_{02}$. The p-type contacting electrode $E_{01}$ is in contact with the p-type doped layer $P_{01}$. The n-type contacting electrode $E_{02}$ is in contact with the n-type doped layer $N_{01}$.

The carrier substrate 112 has a first surface $S_{01}$, a second surface $S_{02}$ and a patterned conductive layer $PC_1$. The first surface $S_{01}$ and the second surface $S_{02}$ are disposed opposite to each other. The patterned conductive layer $PC_1$ is extended from the first surface $S_{01}$ to the second surface $S_{02}$, and divided into a first conductive block $B_{01}$, and a second conductive block $B_{02}$.

The LED element 111 is disposed on the first surface $S_{01}$ of the carrier substrate 112. The p-type contacting electrode $E_{01}$ and the n-type contacting electrode $E_{02}$ of the LED element 111 are electrically connected to part of the patterned conductive layer $PC_1$ by a soldering material $SO_1$.

The package material 113 covers the LED element 111 and part of the patterned conductive layer $PC_1$ for protecting the LED element 111.

The module substrate 12 has a surface $S_{11}$, disposed facing to the second surface $S_{02}$ of the carrier substrate 112. At least one electrical connection pad 121 is disposed on the surface $S_{11}$ of the module substrate 12. The electrical connection pad 121 is also electrically connected to part of the patterned conductive layer $PC_1$ on the second surface $S_{02}$ of the carrier substrate 112 by the soldering material $SO_1$.

However, the LED module 1 does not provide an effective heat dissipation path for dissipating the heat generated from the LED element 111. Therefore, when the LED element 111 operates at high temperatures for a long time, its material will deteriorate quickly, so that the reliability and light emitting efficiency of the LED element 111 are lowered.

SUMMARY OF THE PRESENT INVENTION

The present invention provides an electroluminescent module that can provide a good heat dissipation path and enhance the light emitting efficiency.

An electroluminescent module according to the present invention includes a module substrate, a thermal-conducting carrier substrate and a light-emitting element. The module substrate has an opening, a first surface and a first patterned electrode disposed on the first surface. The thermal-conducting carrier substrate has a carrying element and a second patterned electrode disposed on the carrying element, wherein the carrying element is disposed opposite to the first surface of the module substrate. The second patterned electrode is disposed facing to and electrically connected to the first patterned electrode. The light-emitting element is located at the opening of the module substrate and disposed on the thermal-conducting carrier substrate. The light-emitting element has a first electrode and a second electrode, both of which are respectively electrically connected to corresponding portions of the second patterned electrode of the thermal-conducting carrier substrate.

The material of the thermal-conducting carrier substrate includes ceramics, copper, aluminum, $CuAl_2O_4$ or their combinations. It provides a good heat dissipation path to the light-emitting element. In addition, the electroluminescent module can further include a heat dissipating element, such as a heat sink or a heat pipe. The heat dissipating element is in contact with the thermal-conducting carrier substrate for dissipating heat generated from the light-emitting element.

As mentioned above, an electroluminescent module according to the present invention allows that the light emitted from the light-emitting element can emit directly through the opening because the module substrate is disposed within the opening. As the results, the heat generated from the light-emitting element can be very efficiently dissipated via the heat dissipation path provided by the thermal-conducting carrier substrate with a high coefficient of thermal conductivity. It thereby enhances the light emitting efficiency of the electroluminescent module.

BRIEF DESCRIPTION OF THE DRAWINGS

The present invention will become more fully understood from the detailed description given herein below illustration only, and thus is not limitative of the present invention, and wherein.

DETAILED DESCRIPTION OF THE PRESENT INVENTION

The present invention will be apparent from the following detailed description, which proceeds with reference to the accompanying drawings, wherein the same references relate to the same elements.

Figure 1:
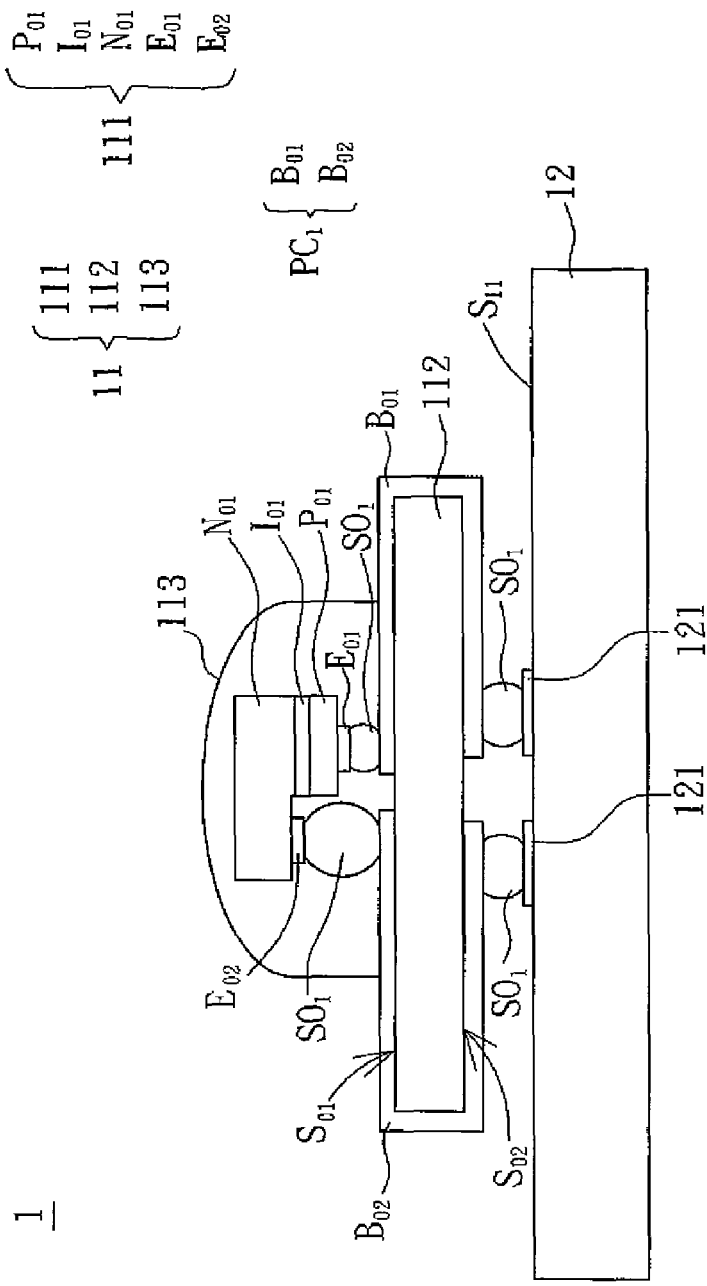
FIG. 1 is a schematic diagram showing a conventional LED module.
Figure 2:
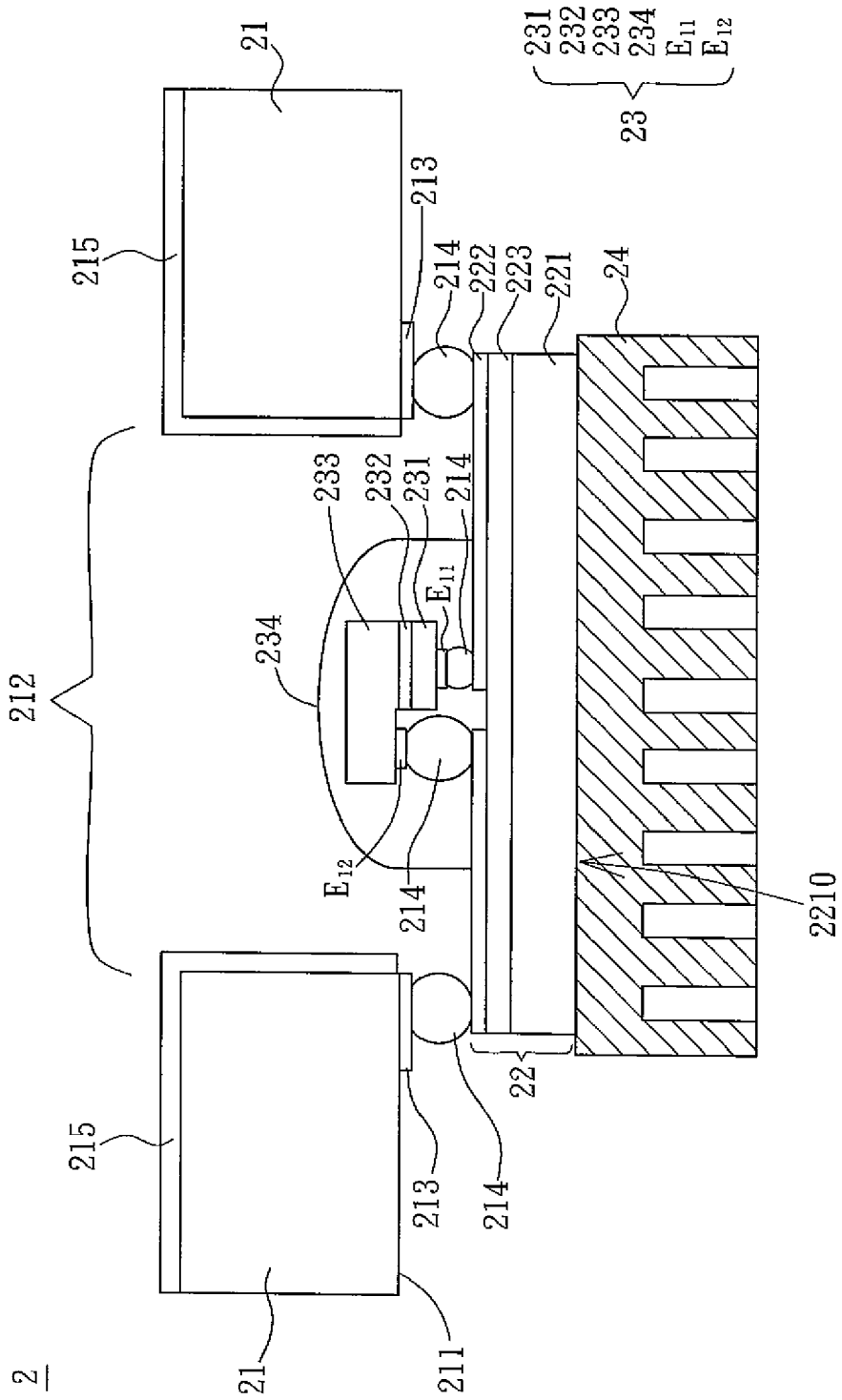
FIG. 2 is a schematic diagram showing an electroluminescent module according to the preferred embodiment of the present invention.

As shown in FIG. 2, an electroluminescent module 2 according to the preferred embodiment of the present invention includes a module substrate 21, a thermal-conducting carrier substrate 22 and a light-emitting element 23. In this embodiment, the light-emitting element 23 can be, for example but not limited to, a light emitting diode (LED).

The module substrate 21, such as a printed circuit board (PCB), has a first surface 211, an opening 212 and a first patterned electrode 213. The first patterned electrode 213 is disposed or formed on the first surface 211. It is noted that the module substrate 21 is formed with leads and electrical connection structures inside, so that the first patterned electrode 213 can be electrically connected with the leads under the bottom of the module substrate 21. In this embodiment, the module substrate 21 can be a plastic substrate, a flexible printed circuit (FPC), a ceramic substrate or a printed circuit board (PCB). Besides, the opening 212 penetrates through the module substrate 21 and can have a circular, square, triangular, polygonal or some other shapes.

The thermal-conducting carrier substrate 22 has a carrying element 221 and a second patterned electrode 222 disposed or formed on the carrying element 221. The carrying element 221 is disposed opposite to the first surface 211 of the module substrate 21. The second patterned electrode 222 is disposed facing to the first patterned electrode 213, and is electrically connected to the first patterned electrode 213 by a soldering material 214, for example. In this embodiment, the thermal-conducting carrier substrate 22 can be a compound material substrate, a metal substrate or a ceramic substrate. The material of the compound material substrate can be, for example but not limited to, ceramics/$CuAl_2O_4$/Cu. The material of the metal substrate can be, for example but not limited to, copper (Cu) and aluminum (Al).

In this embodiment, when the thermal-conducting carrier substrate 22 is made by a non-conductive material, the second patterned electrode 222 can be directly disposed on the carrying element 221. However, if the thermal-conducting carrier substrate 22 is made by a conductive material, the thermal-conducting carrier substrate 22 can further have a heat-conductive insulating layer 223 disposed between the carrying element 221 and the second patterned electrode 222. The heat-conductive insulating layer 223 electrically insulates the patterned electrode 222 and the carrying element 221. It is worth mentioning that the material of the heat-conductive insulating layer 223 can be AlN or SiC. The coefficient of thermal conductivity of AlN is about 200~230 W/mk, and that of SiC is about 300~490 W/mk. Therefore, the heat can be effectively dissipated to the environment.

The light-emitting element 23 is located at the opening 212 of the module substrate 21 and disposed on the thermal-conducting carrier substrate 22. Therefore, the light emitted from the light-emitting element 23 can directly emit via the opening 212 of the module substrate 21. The light-emitting element 23 has a first semiconductor layer 231, a light emitting layer 232, a second semiconductor layer 233, a first electrode $E_{11}$ and a second electrode $E_{12}$. The first semiconductor layer 231, the light emitting layer 232 and the second semiconductor layer 233 are stacked in sequence on a sapphire substrate which may be removed or kept at sequential steps. That is, the light emitting layer 232 is disposed on the first semiconductor layer 231, and the second semiconductor layer 233 is disposed on the light emitting layer 232. The first electrode $E_{11}$ is electrically connected to the first semiconductor layer 231, and the second electrode $E_{12}$ is electrically connected to the second semiconductor layer 233. In this embodiment, the first semiconductor layer 231 is a p-type doped layer, and the second semiconductor layer 233 is an n-type doped layer. Besides, the first electrode $E_{11}$ is directly formed on the first semiconductor layer 231. The second electrode $E_{12}$ is directly formed on the second semiconductor layer 233. Moreover, the first electrode $E_{11}$ and the second electrode $E_{12}$ can be electrically connected to corresponding portions of the second patterned electrode 222 by the soldering material 214, respectively.

In this embodiment, the light-emitting element 23 further includes a package material 234, for example but not limited to a resin, as long as it is a transparent packaging material. The package material 234 covers at least the first semiconductor layer 231, the light emitting layer 232, the second semiconductor layer 233, the first electrode $E_{11}$ and the second electrode $E_{12}$. In addition to protecting the light-emitting element 23, the package material 234 can be appropriately designed as a lens to converge or diverge lights.

The electroluminescent module 2 further includes a heat dissipating element 24 connected to the thermal-conducting carrier substrate 22. In this embodiment, the heat dissipating element 24 is connected to a bottom surface 2210 of the carrying element 221 of the thermal-conducting carrier substrate 22. In particular, the heat dissipating element 24 can be locked or adhered onto the bottom surface 2210. In this embodiment, the heat dissipating element 24 can be a heat sink or a heat pipe. This is not restricted by the present invention.

Figure 3A:
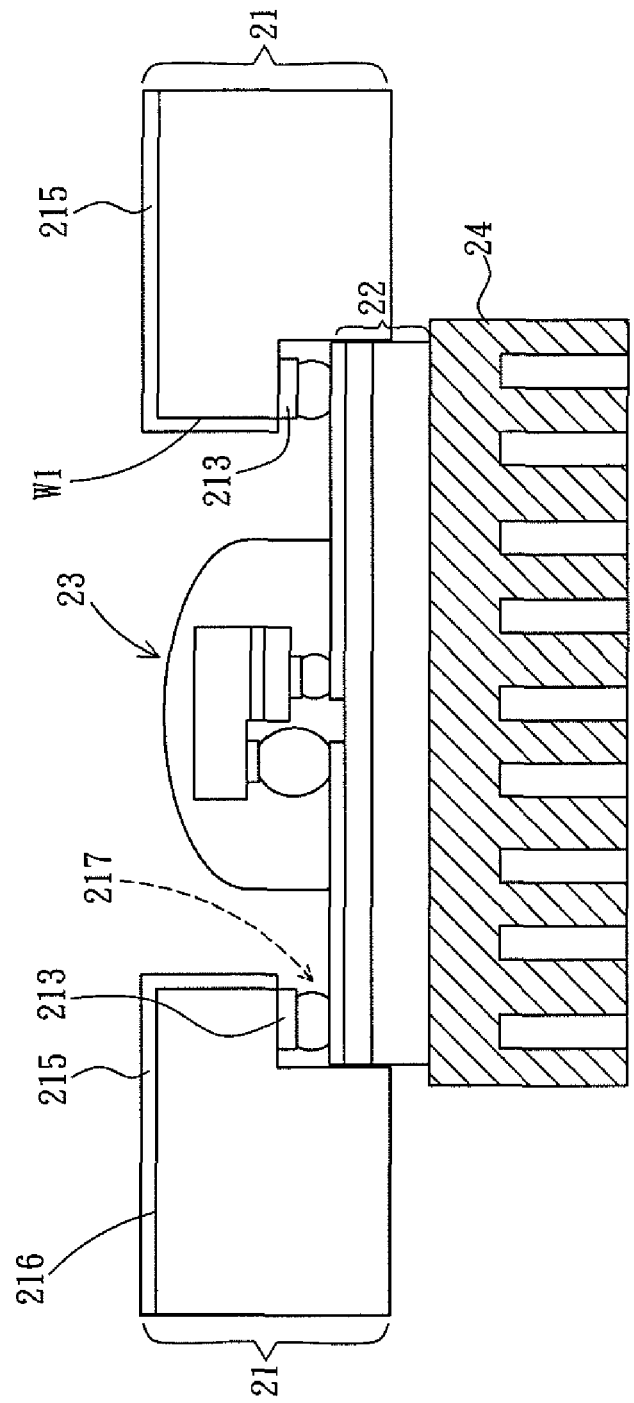
FIG. 3A is another schematic diagram showing an electroluminescent module according to the preferred embodiment of the present invention.

With reference to FIG. 3A, the module substrate 21 of the electroluminescent module 2 can further include a recess 217 and a reflective layer 215.

The recess 217 is formed on the first surface 211 to surround the opening 212. At least part of the first patterned electrode 213 is disposed inside the recess 217. Correspondingly, a part of the thermal-conducting carrier substrate 22 is also disposed inside the recess 217. In this embodiment, the recess 217 can effectively fix the thermal-conducting carrier substrate 22 so that the heat dissipating element 24 is tightly connected to the thermal-conducting carrier substrate 22. This prevents from any possible relative shift or displacement.

The reflective layer 215 is disposed or formed on a second surface 216 opposite to the first surface 211 of the module substrate 21. In addition to the second surface 216, the reflective layer 215 may even extend to a side wall W1 of the opening 212 so that the lights emitted from the light-emitting element 23 can be appropriately reflected which raising the light emitting efficiency. The material of the reflective layer 215 can be Pt, Au, Ag, Pd, Ni, Cr, Ti or their combinations.

Figure 3B:
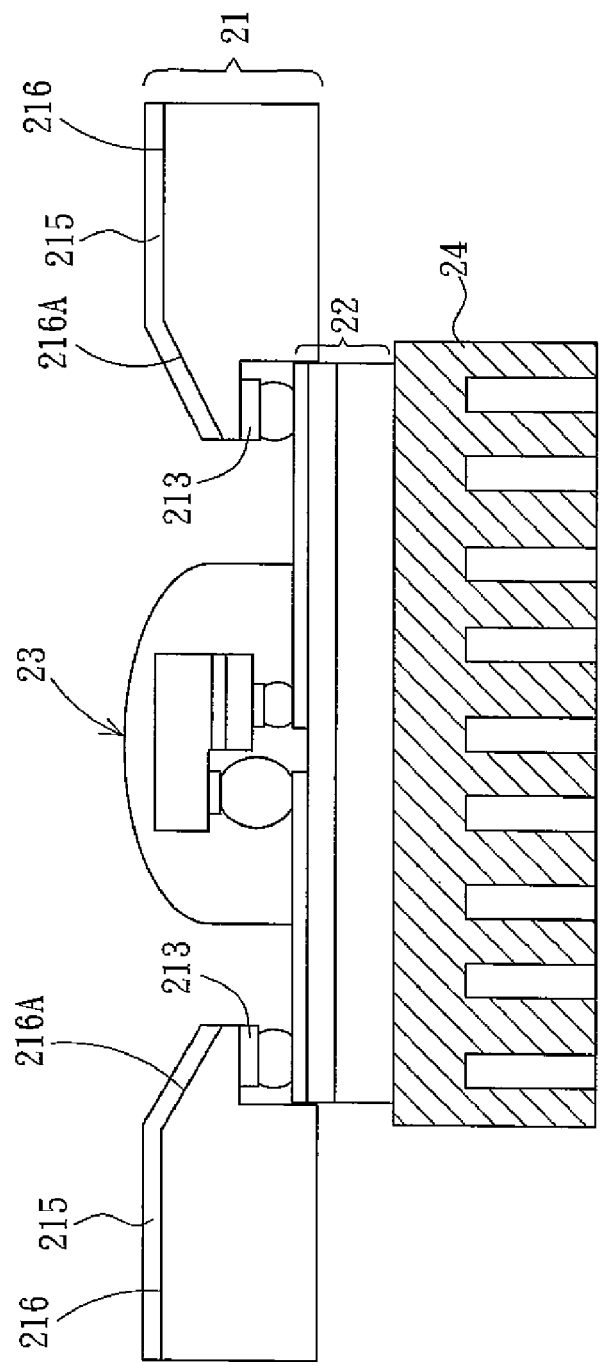
FIG. 3B is yet another schematic diagram showing an electroluminescent module according to the preferred embodiment of the present invention.
Figure 4A:
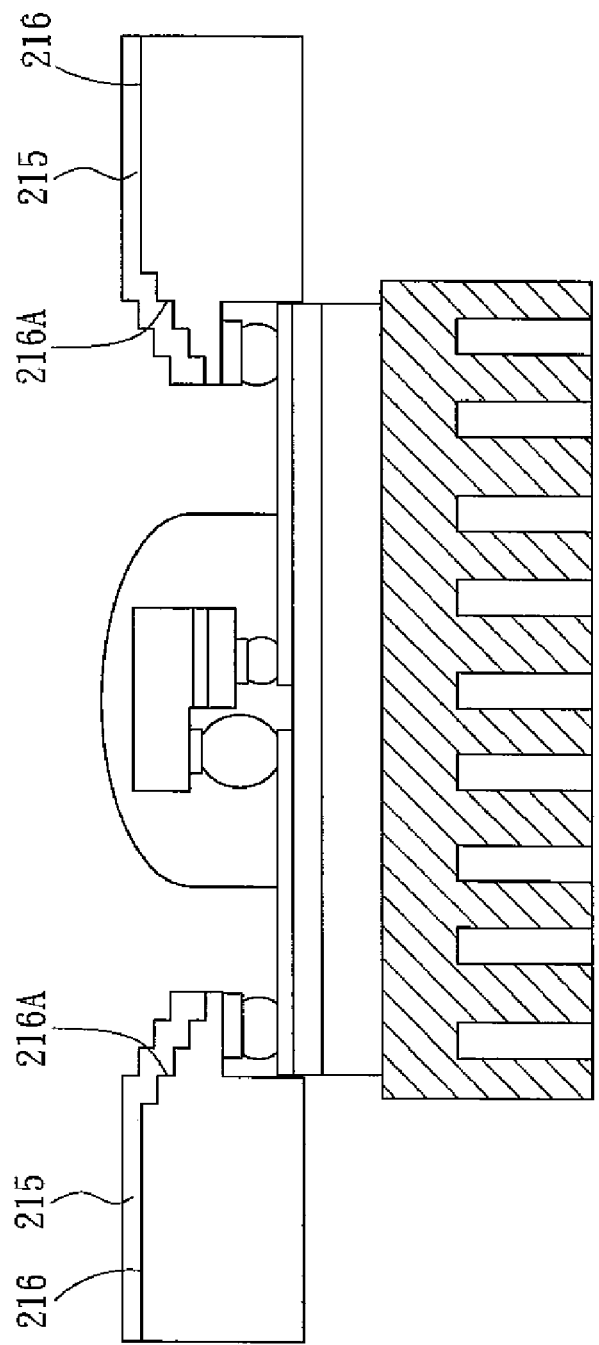
FIGS. 4A to 4C are schematic diagrams showing different cross sections of the second surface of the module substrate in FIG. 3B.
Figure 4B:
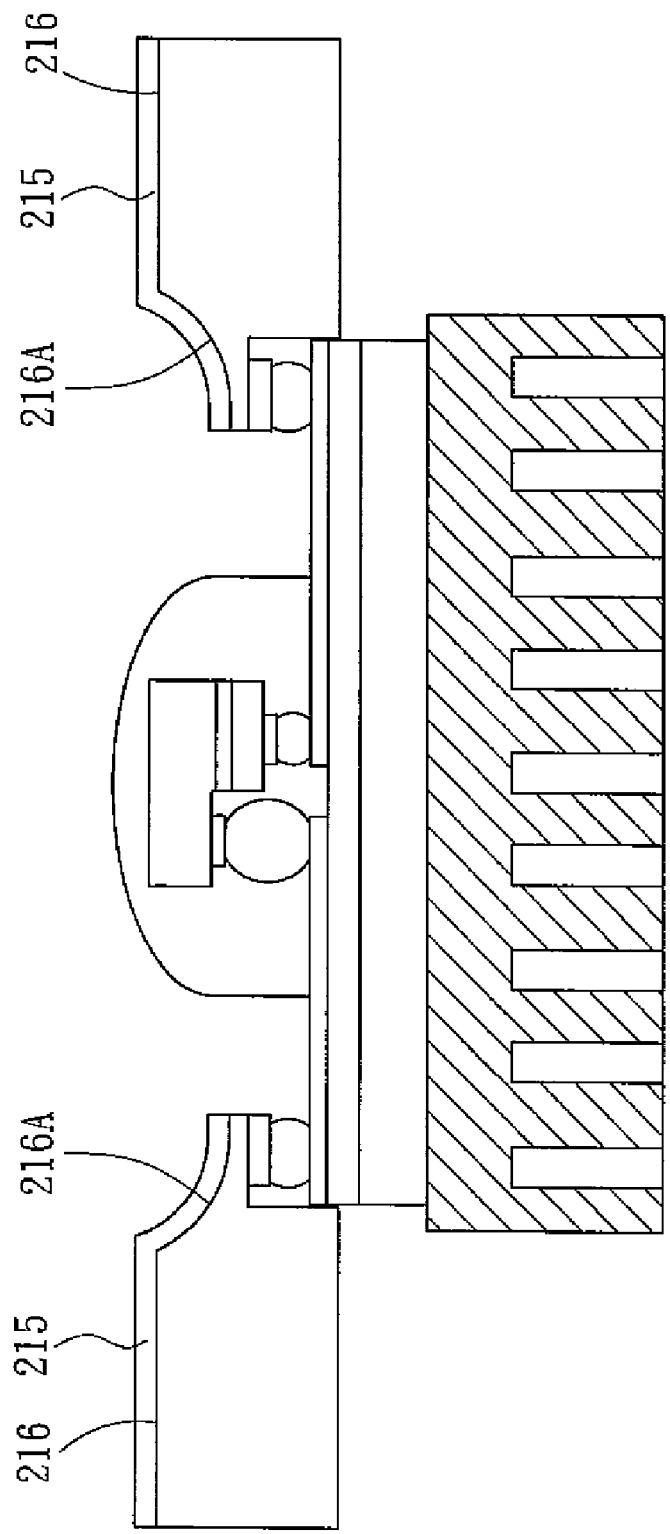
Figure 4C:
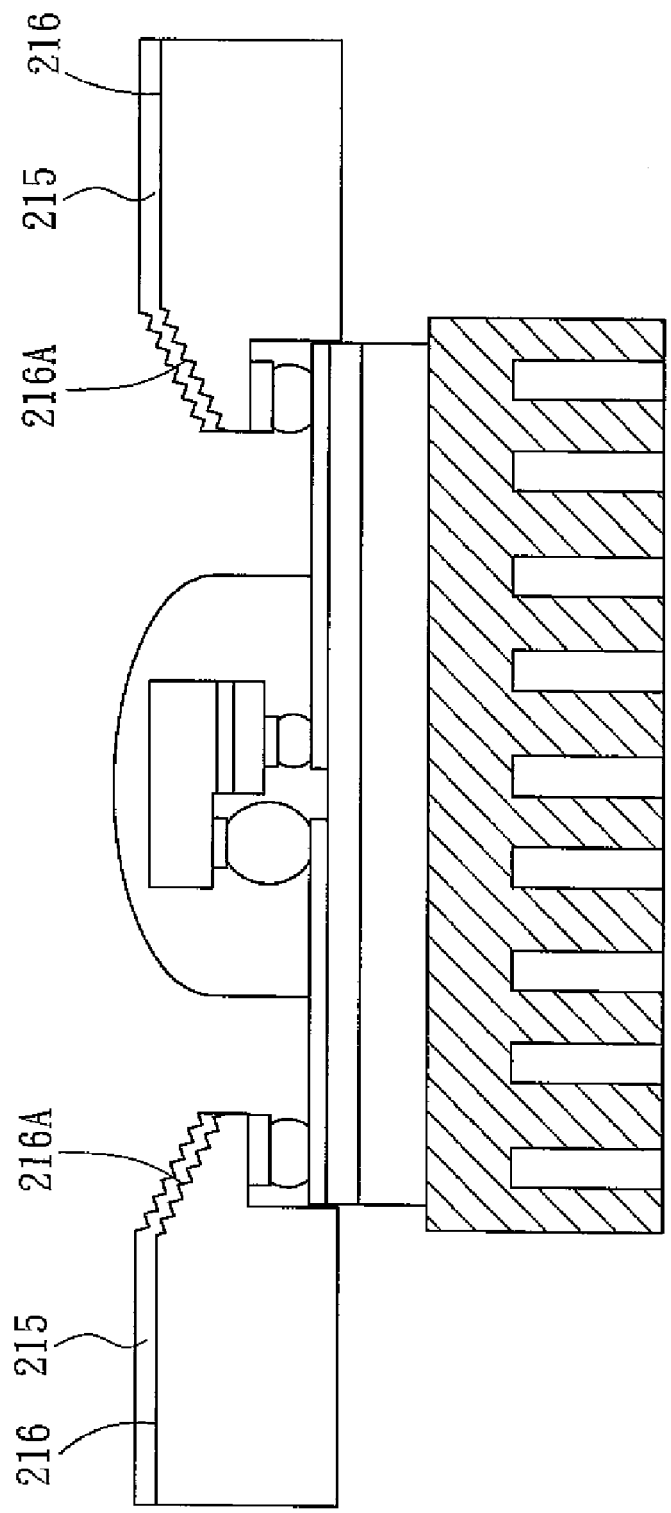

As shown in FIG. 3B, the second surface 216 of the module substrate 21 can have a slant surface 216A formed around the opening 212. With an appropriate design, the reflective layer 215 formed thereon can more effectively reflect the lights for enhancing the light emitting efficiency. In this embodiment, the slant surface 216A can also be a curved surface. Or, the second surface has a cross section with a shape of a ladder (as shown in FIG. 4A), self-arc (as shown in FIG. 4B), multi-sawteeth (as shown in FIG. 4C) or a straight line (as shown FIG. 3B). This is not restricted by the present invention.

The light-emitting element 23 of the electroluminescent module 2 in this embodiment is electrically connected to part of the second patterned electrode 222 of the thermal-conducting carrier substrate 22 by a flip-chip bonding. This is not restricted by the present invention. Of course, according to different embodiments of the light-emitting elements 23, for example vertical structure, it can be connected to part of the second patterned electrode 222 of the thermal-conducting carrier substrate 22 by a wire bonding.

This embodiment utilizes one heat dissipating element 24 for each light-emitting element 23 and each thermal-conducting carrier substrate 22. However, it is not restricted by this embodiment. One heat dissipating element 24 can be shared by a plurality of light-emitting elements 23 and a plurality of thermal-conducting carrier substrates 22.

In summary, an electroluminescent module according to the present invention that the light emitted from the light-emitting element can emit directly from the opening due to the module substrate disposing with the opening. The heat generated from the light-emitting element can be very efficiently dissipated via the heat dissipation path provided by the high thermal conductivity carrier substrate. It thereby enhances the light emitting efficiency of the electroluminescent module. Besides, the reflective layer can effectively reflect the light emitted from the light-emitting element to enhance the light emitting efficiency. Moreover, the recess of the module substrate can stably fix the thermal-conducting carrier substrate, prevent any relative shift or displacement, and promote the reliability of the electroluminescent module.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. An electroluminescent module, comprising:
   a module substrate comprising an opening, a first surface, a first patterned electrode disposed on the first surface, and a recess foamed on the first surface to surround the opening;
   a thermal-conducting carrier substrate comprising a carrying element and a second patterned electrode disposed on the carrying element, wherein the carrying element is disposed opposite to the first surface of the module substrate, and the second patterned electrode is disposed facing to and electrically connected to the first patterned electrode; and
   a light-emitting element located at the opening of the module substrate, disposed on the thermal-conducting carrier substrate, comprising a first electrode and a second electrode, both of which are respectively electrically connected to corresponding portions of the second patterned electrode of the thermal-conducting carrier substrate, and comprising a package material without covering the module substrate,
   wherein the recess fixes the thermal-conducting carrier substrate so that a heat dissipating element is tightly connected to the thermal-conducting carrier substrate.

2. The electroluminescent module of claim 1, wherein the opening comprises a circular, square, triangular, or polygonal.

3. The electroluminescent module of claim 1, wherein at least one part of the first patterned electrode is disposed inside the recess.

4. The electroluminescent module of claim 1, wherein a part of the thermal-conducting carrier substrate is disposed inside the recess.

5. The electroluminescent module of claim 1, wherein the module substrate is a plastic substrate, a flexible printed circuit, a ceramic substrate or a printed circuit board, and the thermal-conducting carrier substrate is a compound material substrate, a metal substrate or a ceramic substrate.

6. The electroluminescent module of claim 1, wherein the module substrate further comprises a second surface and a reflective layer, the second surface is disposed opposite to the first surface, and the reflective layer is disposed on the second surface.

7. The electroluminescent module of claim 1, wherein the module substrate further comprises a second surface disposed opposite to the first surface, and the second surface has a slant surface or a curved surface formed around the opening.

8. The electroluminescent module of claim 7, wherein the second surface has a cross section with a shape of a ladder, self-arc, multi-sawteeth, or a straight line.

9. The electroluminescent module of claim 1, wherein the module substrate further comprises a reflective layer formed on a side wall of the opening.

10. The electroluminescent module of claim 1, wherein the thermal-conducting carrier substrate comprises ceramics, copper, aluminum, $CuAl_2O_4$ or their combinations.

11. The electroluminescent module of claim 1, wherein the thermal-conducting carrier substrate further comprises a heat-conductive insulating layer disposed between the carrying element and the second patterned electrode.

12. The electroluminescent module of claim 11, wherein the heat-conductive insulating layer comprises MN or SiC.

13. The electroluminescent module of claim 1, wherein the heat dissipating element is connected to a bottom surface of the carrying element of the thermal-conducting carrier substrate.

14. The electroluminescent module of claim 1, wherein the heat dissipating element is a heat sink or a heat pipe.

15. The electroluminescent module of claim 1, wherein the light-emitting element is a light emitting diode, and the light-emitting element at least comprises:
   a first semiconductor layer;
   a light emitting layer disposed on the first semiconductor layer; and
   a second semiconductor layer disposed on the light emitting layer.

16. The electroluminescent module of claim 15, wherein the first semiconductor layer is a p-type doped layer and the second semiconductor layer is an n-type doped layer.

17. The electroluminescent module of claim 15, wherein the first electrode is electrically connected to the first semiconductor layer and the second electrode is electrically connected to the second semiconductor layer.

18. The electroluminescent module of claim 15, wherein the package material covers at least the first semiconductor layer, the light emitting layer, the second semiconductor layer, the first electrode and the second electrode, and comprises resin or transparent packaging materials.

19. The electroluminescent module of claim 1, wherein the light-emitting element is electrically connected to a part of the second patterned electrode of the thermal-conducting carrier substrate by a flip-chip bonding or a wire bonding.

20. An electroluminescent module, comprising:
   a module substrate comprising an opening, a first surface, a second surface, a reflective layer, and a first patterned electrode disposed on the first surface, wherein the second surface is disposed opposite to the first surface and formed around the opening, and the reflective layer is disposed on the second surface and extends to a side wall of the opening;
   a thermal-conducting carrier substrate comprising a carrying element and a second patterned electrode disposed on the carrying element, wherein the carrying element is disposed opposite to the first surface of the module substrate, and the second patterned electrode is disposed facing to and electrically connected to the first patterned electrode; and
   a lighting-emitting element located at the opening of the module substrate, disposed on the thermal-conducting carrier substrate, and comprising a first electrode and a second electrode, both of which are respectively electrically connected to corresponding portions of the second patterned electrode of the thermal-conducting carrier substrate.

* * * * *